(12) United States Patent
Lin et al.

(10) Patent No.: US 11,488,957 B1
(45) Date of Patent: Nov. 1, 2022

(54) SEMICONDUCTOR STRUCTURE AND METHOD FOR MANUFACTURING THE SAME

(71) Applicant: NANYA TECHNOLOGY CORPORATION, New Taipei (TW)

(72) Inventors: Li-Han Lin, Taoyuan (TW); Jen-I Lai, Taoyuan (TW); Chun-Heng Wu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/241,370

(22) Filed: Apr. 27, 2021

(51) Int. Cl.
*H01L 27/108* (2006.01)

(52) U.S. Cl.
CPC .. *H01L 27/10808* (2013.01); *H01L 27/10855* (2013.01); *H01L 27/10873* (2013.01)

(58) Field of Classification Search
None
See application file for complete search history.

(56) References Cited

U.S. PATENT DOCUMENTS

| 2004/0036051 A1* | 2/2004 | Sneh | H01L 27/10861 257/E21.651 |
| 2009/0085156 A1* | 4/2009 | Dewey | H01L 27/10852 257/532 |

* cited by examiner

*Primary Examiner* — Anthony Ho
*Assistant Examiner* — Kevin Quinto
(74) *Attorney, Agent, or Firm* — Muncy, Geissler, Olds & Lowe, P.C.

(57) ABSTRACT

The present disclosure provides a semiconductor structure having a memory structure and a method for manufacturing the semiconductor structure. The semiconductor structure includes a first layer, a second layer over the first layer, a third layer over the second layer, and a trench capacitor. The trench capacitor is disposed in a trench penetrating the first layer, the second layer, and the third layer. The trench capacitor includes a bottom metal layer, a middle insulating layer, and a top metal layer. The bottom metal layer covers a side wall of the first layer, a side wall of the second layer, and a first portion of a side wall of the third layer. The middle insulating layer covers the bottom metal layer and a second portion of the side wall of the third layer. The top metal layer covers the middle insulating layer.

19 Claims, 20 Drawing Sheets

SEMICONDUCTOR STRUCTURE AND METHOD FOR MANUFACTURING THE SAME

TECHNICAL FIELD

The present disclosure relates to a semiconductor structure and a method for manufacturing the same, and more particularly, to a semiconductor structure having a memory structure and a method for manufacturing the same.

DISCUSSION OF THE BACKGROUND

For the past decades, in the semiconductor industry, the critical dimension of the semiconductor elements has shrunk fast. Thereby, the density of features in an integrated circuit increases dramatically. For example, shrinking the size of the transistor allows a memory device to include more transistors on a chip, which leads to improve the capability of the memory device. However, the process for fabricating elements with smaller critical dimension becomes more difficult to maintain the accuracy within the process tolerance. Also, more and more electrical defects occurs when the elements keep being shrunk. For example, the capacitance of a capacitor indicating an amount of charge that the capacitor can store is determined by the structure and the material itself. When the accuracy of the process decreases, the structure may change so as to affect the capacitance of the capacitor. If the capacitance deviates away from the predetermined range, the capacitor may not meet the requirement of the semiconductor structure. The yield is thus decreased. Therefore, avoiding the electrical defects when scaling down the critical dimension becomes a critical issue in this field.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure including a first layer, a second layer over the first layer, a third layer over the second layer, and a trench capacitor. The trench capacitor is disposed in a trench penetrating the first layer, the second layer, and the third layer. The trench capacitor includes a bottom metal layer, a middle insulating layer, and a top metal layer. The bottom metal layer covers a side wall of the first layer, a side wall of the second layer, and a first portion of a side wall of the third layer. The middle insulating layer covers the bottom metal layer and a second portion of the side wall of the third layer. The top metal layer covers the middle insulating layer.

In some embodiments, the semiconductor structure further includes a transistor. The transistor is disposed below the first layer and includes a gate structure. The gate structure is in contact with the bottom metal layer.

In some embodiments, the bottom metal layer includes titanium (Ti), the top metal layer includes Ti, and the middle insulating layer includes zirconium oxide ($ZrO_2$).

In some embodiments, the middle insulating layer further covers a top surface of the third layer In some embodiments, the middle insulating layer is in contact with a corner of the third layer. The corner connects a top surface of the third layer and the second portion of the side wall of the third layer.

In some embodiments, the first portion of the side wall of the third layer and the second portion of the side wall of the third layer are arranged in a straight line.

In some embodiments, the first layer includes borophosphosilicate glass (BPSG), the second layer includes tetraethoxysilane (TEOS), and the third layer includes silicon nitride (SiN).

Another aspect of the present disclosure provides a semiconductor structure including a transistor and a trench capacitor. The transistor includes a gate structure. The trench capacitor is in contact with the gate structure. The trench capacitor includes a bottom metal layer, a middle insulating layer, and a top metal layer. The bottom metal layer has a vertical portion and a horizontal portion. The horizontal portion is in contact with the gate structure. The middle insulating layer has a first step portion covering a top surface of the vertical portion of the bottom metal layer. The top metal layer covers the middle insulating layer in its entirety.

In some embodiments, the semiconductor structure further includes a first layer over the transistor, a second layer over the first layer, and a third layer over the second layer. The trench capacitor is disposed in a trench penetrating the first layer, the second layer, and the third layer.

In some embodiments, the middle insulating layer further has a second step portion covering and in contact with a top surface of the third layer and a first portion of a side wall of the third layer.

In some embodiments, the bottom metal layer covers a second portion of the side wall of the third layer.

In some embodiments, the first portion of the side wall of the third layer and the second portion of the side wall of the third layer are arranged in a straight line.

In some embodiments, the top metal layer has a first step portion and a second portion. The first step portion of the top metal layer covers the first step portion of the middle insulating layer, and the second step portion of the top metal layer convers the second step portion of the middle insulating layer.

In some embodiments, the trench capacitor forms an opening extending from the third layer to the first layer. The opening has a first horizontal width associated with the first step portion of the third layer and a second horizontal width associated with the second step portion of the third layer. The second horizontal width is greater than the first horizontal width.

Another aspect of the present disclosure provides a method for manufacturing a semiconductor structure, including the operations of: forming a transistor; forming a plurality of layers having a trench over the transistor, wherein the plurality of layers comprises a first layer, a second layer, and a third layer, and the trench penetrates the first layer, the second layer, and the third layer; and forming a trench capacitor in the trench. The operation of forming a trench capacitor in the trench includes the operations of: depositing a bottom metal layer to cover a side wall of the first layer, a side wall of the second layer, a side wall of the third layer, a top surface of the third layer, and a top surface of a gate structure of the transistor; etching the bottom metal layer to expose the top surface of the third layer and a first portion of the side wall of the third layer; depositing a middle insulating layer to cover the top surface of the third layer, the first portion of the side wall of the third layer, and the bottom metal layer; and depositing a top metal layer to cover the middle insulating layer.

In some embodiments, the operation of etching the bottom metal layer to expose the top surface of the third layer and the first portion of the side wall of the third layer includes the operations of: depositing a sacrificial oxide layer to cover the bottom metal layer; etching the sacrificial oxide layer to expose the bottom metal layer, wherein after etching the sacrificial oxide layer, a top surface of the sacrificial oxide layer corresponds to the first portion of the side wall of the third layer; etching the bottom metal layer to expose the first portion of the side wall of the third layer and the top surface of the third layer; and removing the sacrificial oxide layer remaining over the bottom metal layer.

In some embodiments, after the operation of etching the bottom metal layer to expose the first portion of the side wall of the first layer and the top surface of the third layer, a top surface of the bottom metal layer is coplanar with a top surface of the sacrificial oxide layer.

In some embodiments, after the operation of etching the bottom metal layer to expose the first portion of the side wall of the third layer and the top surface of the third layer, the bottom metal layer has a portion in contact with a second portion of the side wall of the third layer.

In some embodiments, the first portion of the side wall of the third layer and the second portion of the side wall of the third layer are arranged in a straight line.

In some embodiments, the operation of forming the plurality of layers having the trench over the transistor includes the operations of: depositing a photoresist layer over the third layer; patterning the photoresist layer to form a patterned mask layer; etching the third layer, the second layer, and the first layer to form the trench according to the patterned mask layer; and removing the patterned mask layer.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

Figure 1:
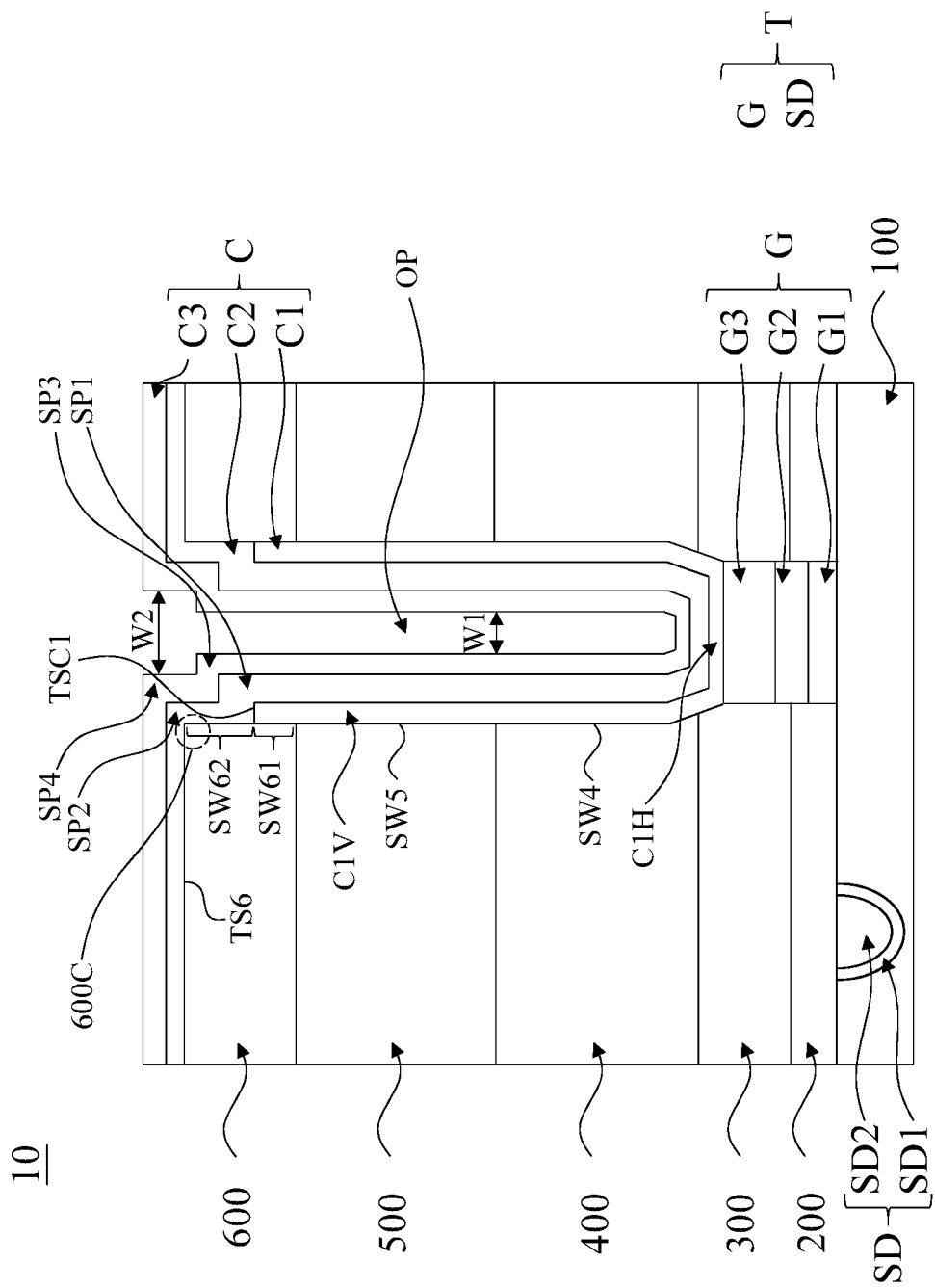
FIG. 1 is a schematic diagram of a semiconductor structure according to some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic diagram of a semiconductor structure 10 according to some embodiments of the present disclosure. The semiconductor structure 10 is a memory structure. In some embodiments, the semiconductor structure 10 is a dynamic random access memory (DRAM) structure.

The semiconductor structure 10 shown in FIG. 1 includes a memory cell which includes a transistor T and a trench capacitor C. The transistor T is disposed on a semiconductor substrate. The trench capacitor C is disposed over the transistor T. More specifically, the trench capacitor C is in contact with a gate structure G of the transistor T. In FIG. 1, the semiconductor structure 10 only shows the gate structure G and a source/drain contact SD, and the rest part of the transistor T (such as a channel region) is omitted to facilitate understanding.

As illustrated in FIG. 1, the transistor T shown in the semiconductor structure 10 includes the gate structure G and the source/drain contact SD. In order to prevent the source/drain contact SD from electrically coupling to the gate structure G, an isolation region 100 is configured to isolate the gate structure G from the source/drain contact SD. The gate structure G is disposed over the isolation region 100, and the source/drain contact SD is arranged in the isolation region 100. In some embodiments, the isolation region 100 is a shallow trench isolation (STI).

The gate structure G includes a contact structure G1, an adhesive layer G2, and a metal layer G3. The contact structure G1 is disposed over the isolation region 100; the adhesive layer G2 is disposed over the contact structure G2; and the metal layer G3 is disposed over the adhesive layer G2. In some embodiments, the contact structure G1 includes polysilicon. In some embodiments, the adhesive layer G2 includes silicon nitride (SiN). In some embodiments, the metal layer G3 includes tungsten (W).

The source/drain contact SD includes an adhesive layer SD1 and a contact metal layer SD2. The adhesive layer SD1 surrounds the contact metal layer SD2. The adhesive layer SD1, the contact metal layer SD2 and the isolation region 100 are coplanar. In some embodiments, the adhesive layer SD1 includes polysilicon. In some embodiments, the contact metal layer SD2 includes W.

The semiconductor structure 10 further includes a first nitride layer 200 and a second nitride layer 300. The first nitride layer 200 is disposed over the isolation region 100 and in contact with the source/drain contact SD. The second nitride layer 300 is disposed over the first nitride layer 200. As illustrated in FIG. 1, the first nitride layer 200 and the second nitride layer 300 surround the gate structure G. In some embodiments, a top surface of the second nitride layer 300 is higher than a top surface of the metal layer G3. In some embodiments, the first nitride layer 200 includes SiN. In some embodiments, the second nitride layer 300 includes SiN.

The semiconductor structure 10 further includes a first interlayer dielectric (ILD) layer 400, a second ILD layer 500, and a third ILD layer 600. The first ILD layer 400 is disposed over the second nitride layer 300; the second ILD layer 500 is disposed over the first ILD layer 400; and the third ILD layer 600 is disposed over the second ILD layer 500. A trench TR (please refer to FIG. 10 for illustration) is formed in the first ILD layer 400, the second ILD layer 500, and the third ILD layer 600. The trench TR penetrates the first ILD layer 400, the second ILD layer 500, and the third ILD layer 600, and further penetrates a portion of the second nitride layer 300 to reach the top surface of the metal layer G3. The trench capacitor C is disposed in the trench TR.

In some embodiments, the first ILD layer 400 includes borophosphosilicate glass (BPSG). In some embodiments, the second ILD layer 500 includes tetraethoxysilane (TEOS). In some embodiments, the third ILD layer 600 includes SiN. The first IDL layer 400, the second ILD layer 500, and the third ILD layer 600 are deposited by performing chemical vapor deposition (CVD) process, such as atmospheric pressure CVD (APCVD), low-pressure CVD (LPCVD), and plasma-enhanced CVD (PECVD).

The trench capacitor C is a metal-insulator-metal structure, which includes a bottom metal layer C1, a middle insulating layer C2, and a top metal layer C3.

The bottom metal layer C1 is disposed along a contour of the trench TR. More specifically, the bottom metal layer C1 is disposed to be in contact with the top surface of the metal layer G3, and to cover a side wall SW4 of the first ILD layer 400, a side wall SW5 of the second ILD layer 500, and a first portion of side wall SW61 of the third ILD layer 600. As illustrated in FIG. 1, the bottom metal layer C1 includes a horizontal portion C1H and a vertical portion C1V. The horizontal portion C1H is in contact with the top surface of the metal layer G1, and the vertical portion C1V is in contact with the side wall SW4, the side wall SW5, and the first portion of side wall SW61.

The middle insulating layer C2 is disposed to cover the bottom metal layer C1 and the third ILD layer 600. More specifically, the middle insulating layer C2 is in contact with the bottom metal layer C1, a second portion of side wall SW62 of the third ILD layer 600, and a top surface TS6 of the third ILD layer 600. It is noted that the first portion of side wall SW61 and the second portion of side wall SW62 are substantially arranged in a straight line. As illustrated in FIG. 1, the middle insulating layer C2 includes a first step portion SP1 and a second portion SP2. The first step portion SP1 is in contact with a top surface TSC1 of the vertical portion C1V of the bottom metal layer C1, and the second step portion SP2 is in contact with the top surface TS6 and the second portion of side wall SW62 of the third ILD layer 600. Alternatively stated, the step portion SP2 of the middle insulating layer C2 is in contact with a corner 600C (denoted by a dash circle in FIG. 1) connecting the top surface TS6 and the second portion of side wall SW62 of the third ILD layer 600.

In some embodiments, a thickness of the third ILD layer 600 is about 80 to 130 nm. In some embodiments, a length of the second portion of side wall SW62 is about 40 to 80 nm.

The top metal layer C3 is disposed to cover the middle insulating layer C2. In some embodiments, the top metal layer C3 covers the middle insulating layer C2 in its entirety. The top metal layer C3 includes a first step portion SP3 and a second step portion SP4. The first step portion SP3 of the top metal layer C3 covers the first step portion SP1 of the middle insulating layer C2, and the second step portion SP4 of the top metal layer C3 covers the second step portion SP2 of the middle insulating layer C2.

As illustrated in FIG. 1, a contour of the top metal layer C3 of the trench capacitor C forms an opening OP extending from the third ILD layer 600 to the first ILD layer 400. The opening OP has a first horizontal width W1 associated with the first step portion SP3 of the top metal layer C3 and a second horizontal width W2 associated with the second step portion SP4 of the top metal layer C3. The second horizontal width W2 is greater than the first horizontal width W1.

In some embodiments, the bottom metal layer C1 includes TiN. In some other embodiments, the bottom metal layer C1 includes titanium silicon nitride (TiSiN). In some embodiments, the middle insulating layer C2 is a high-k dielectric layer including zirconium oxide ($ZrO_2$), hafnium oxide ($HfO_2$), titanium oxide ($TiO_2$), or the combination thereof. In some embodiments, the top metal layer C3 includes TiN. In some other embodiments, the top metal layer C3 includes titanium silicon nitride (TiSiN).

Reference is made to FIG. 2 to FIG. 16. FIG. 2 to FIG. 16 are schematic diagrams of semiconductor structure 10 in each manufacturing step according to some embodiments of the present disclosure. To facilitate understanding, similar elements shown in FIG. 2 to FIG. 16 are designated with the same the numerals as designated in FIG. 1.

Figure 2:
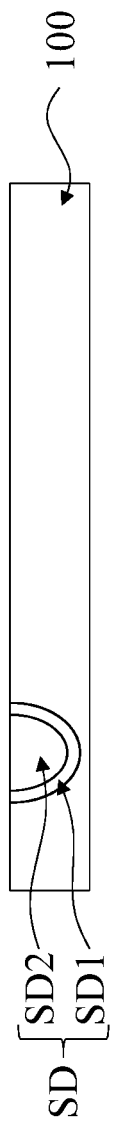
FIG. 2 is a schematic diagram of a semiconductor structure in a manufacturing step according to some embodiments of the present disclosure.

In FIG. 2, the substrate is provided with the source/contact SD of the transistor T and the isolation region 100. The source/contact SD is formed in the isolation region 100.

Figure 3:
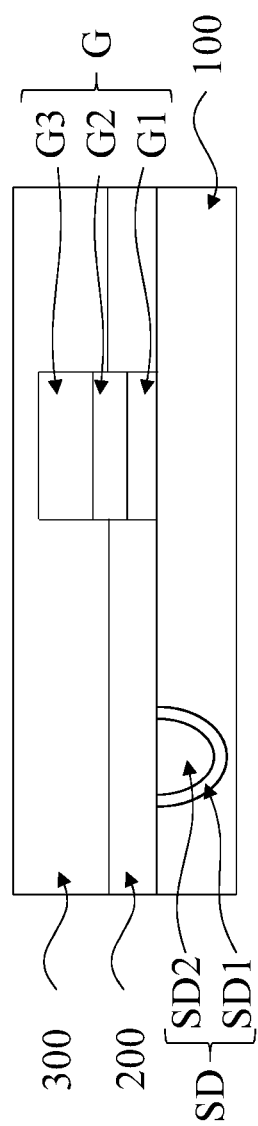
FIG. 3 is a schematic diagram of a semiconductor structure in a manufacturing step according to some embodiments of the present disclosure.

In FIG. 3, the gate structure G of the transistor T is formed on the isolation region 100, and the first nitride layer 200 and the second nitride 300 are formed to protect the metal layer G3 of the gate structure G. In some embodiments, the transistor T is a buried transistor.

Figure 4:
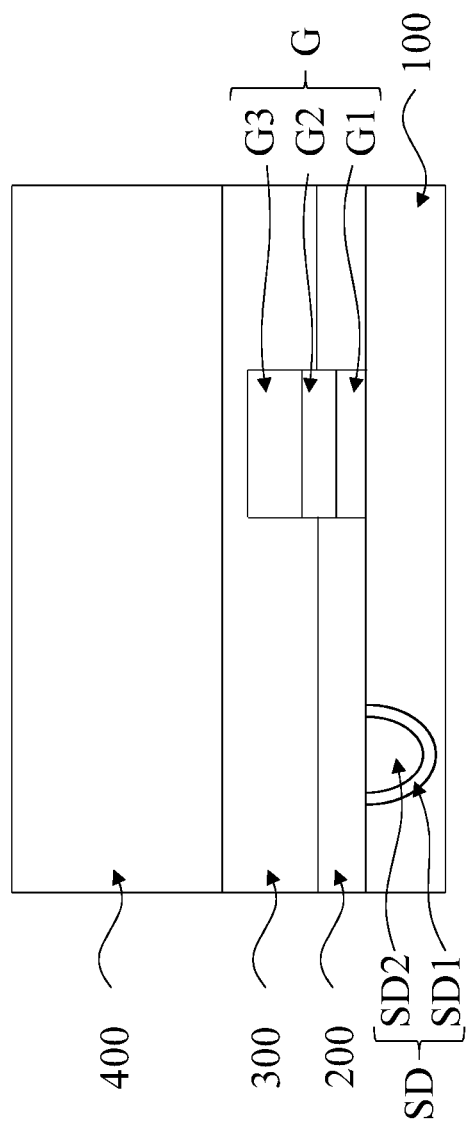
FIG. 4 is a schematic diagram of a semiconductor structure in a manufacturing step according to some embodiments of the present disclosure.

In FIG. 4, the first ILD layer 400 is deposited over the second nitride layer 300. In some embodiments, after the first ILD layer 400 is deposited, an anneal process is performed to cure the defect in the first ILD layer 400 and to improve the physical characteristic of the first ILD layer 400. For example, the stress in the lattice of first ILD layer 400 is decreased after annealing. In some embodiments, a chemical mechanical planarization (CMP) is perform to flatten a top surface of the first ILD layer 400.

Figure 5:
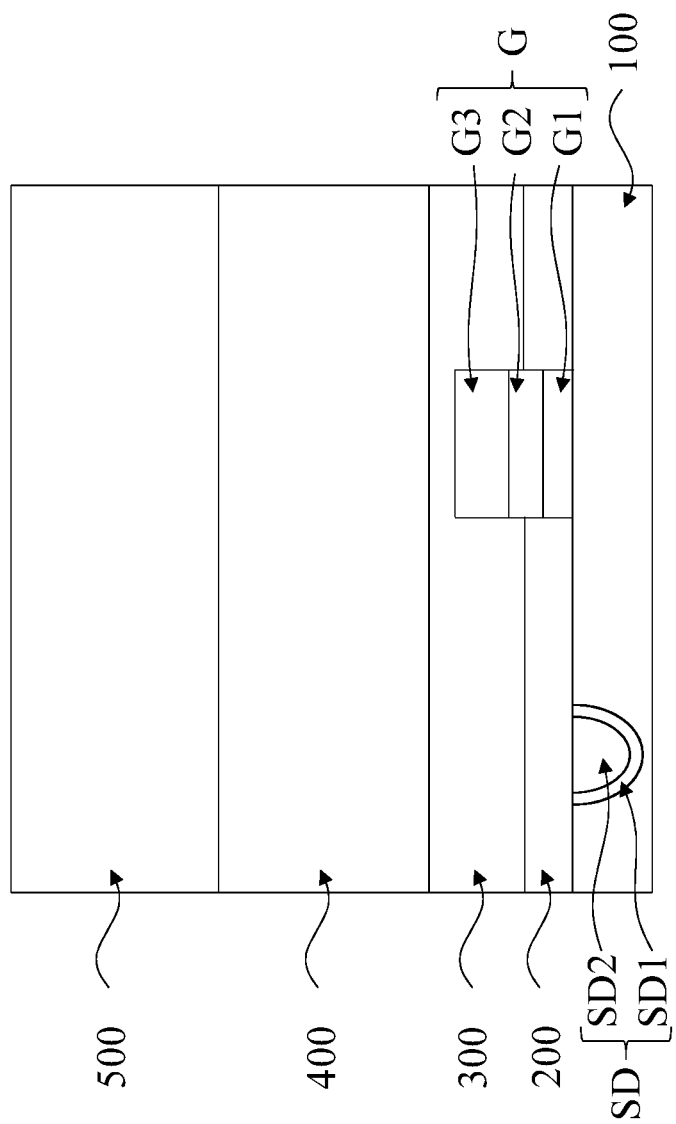
FIG. 5 is a schematic diagram of a semiconductor structure in a manufacturing step according to some embodiments of the present disclosure.

In FIG. 5, the second ILD layer 500 is deposited over the first ILD layer 400.

Figure 6:
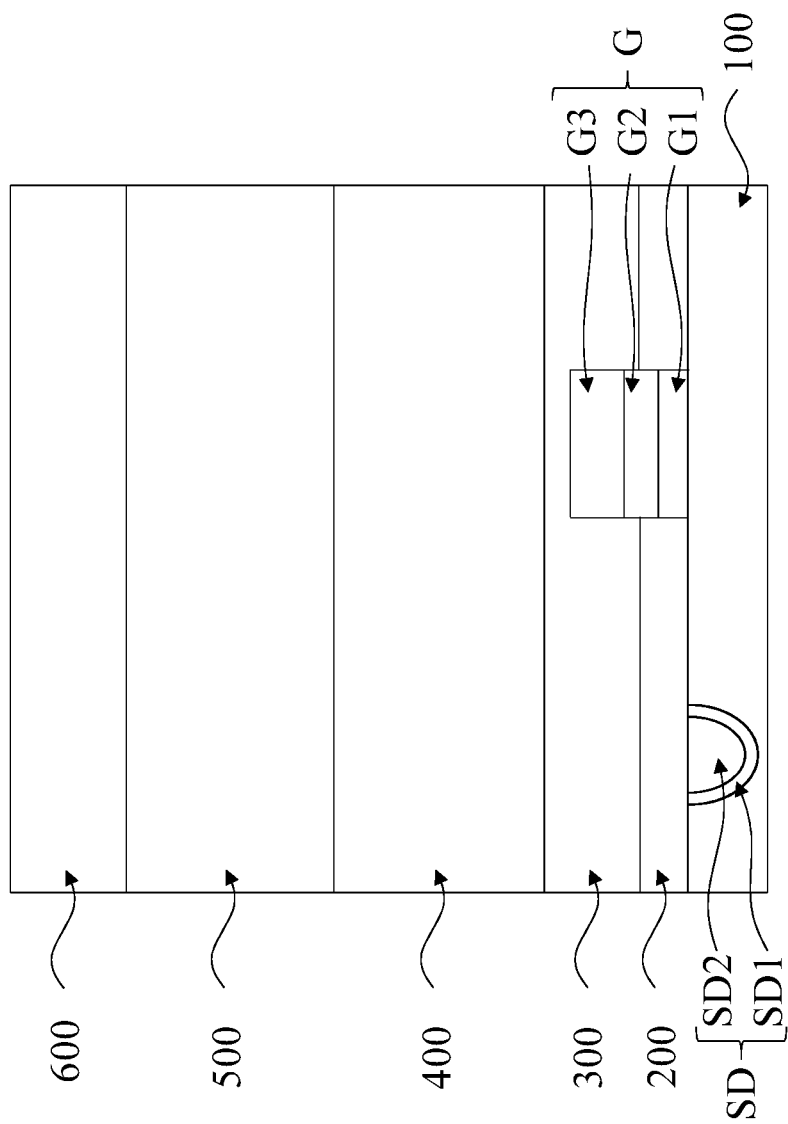
FIG. 6 is a schematic diagram of a semiconductor structure in a manufacturing step according to some embodiments of the present disclosure.

In FIG. 6, the third ILD layer 600 is deposited over the second ILD layer 500. In some embodiments, the third ILD layer includes SiN which is also referred to as a top SiN layer.

Figure 7:
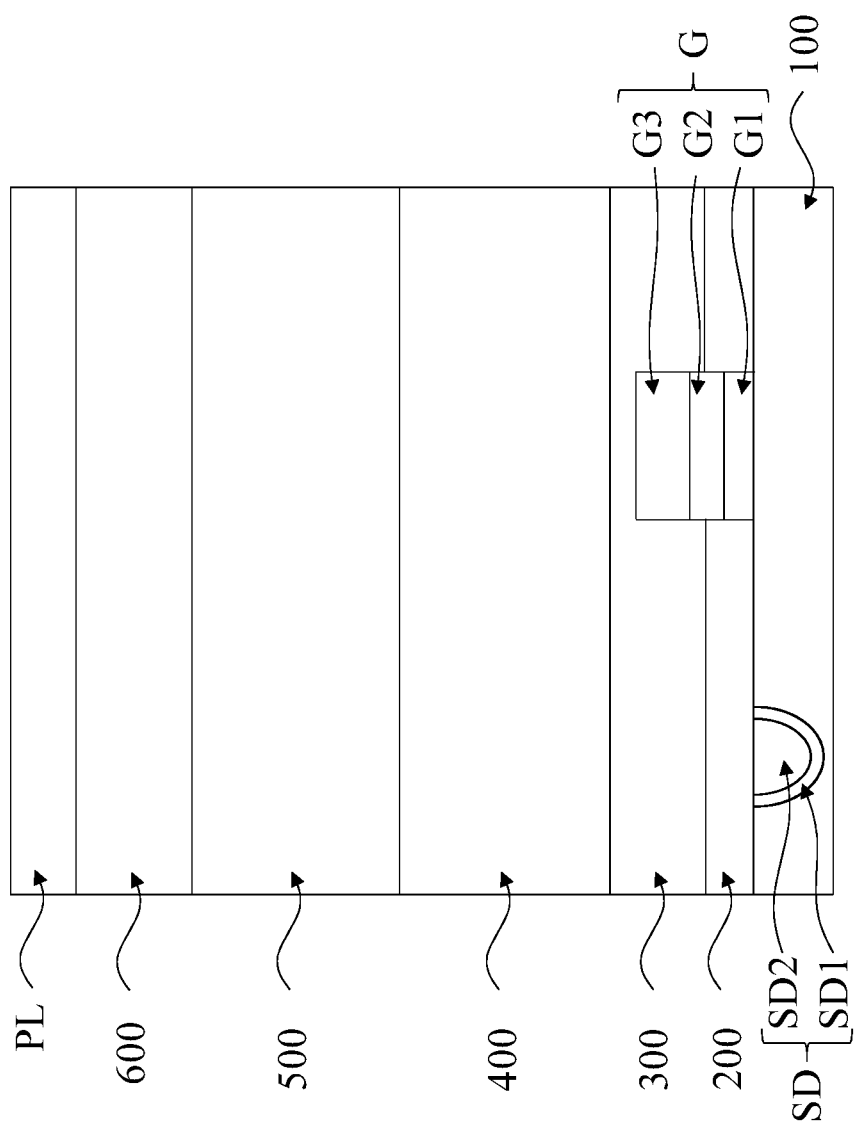
FIG. 7 is a schematic diagram of a semiconductor structure in a manufacturing step according to some embodiments of the present disclosure.

In FIG. 7, a photoresist layer PL is deposited over the third ILD layer 600. In some embodiments, the photoresist layer PL is deposited by performing a spin coating process on the third ILD layer 600. The photoresist layer PL is configured to be a mask layer to prevent the underneath layer from the following etching process.

Figure 8:
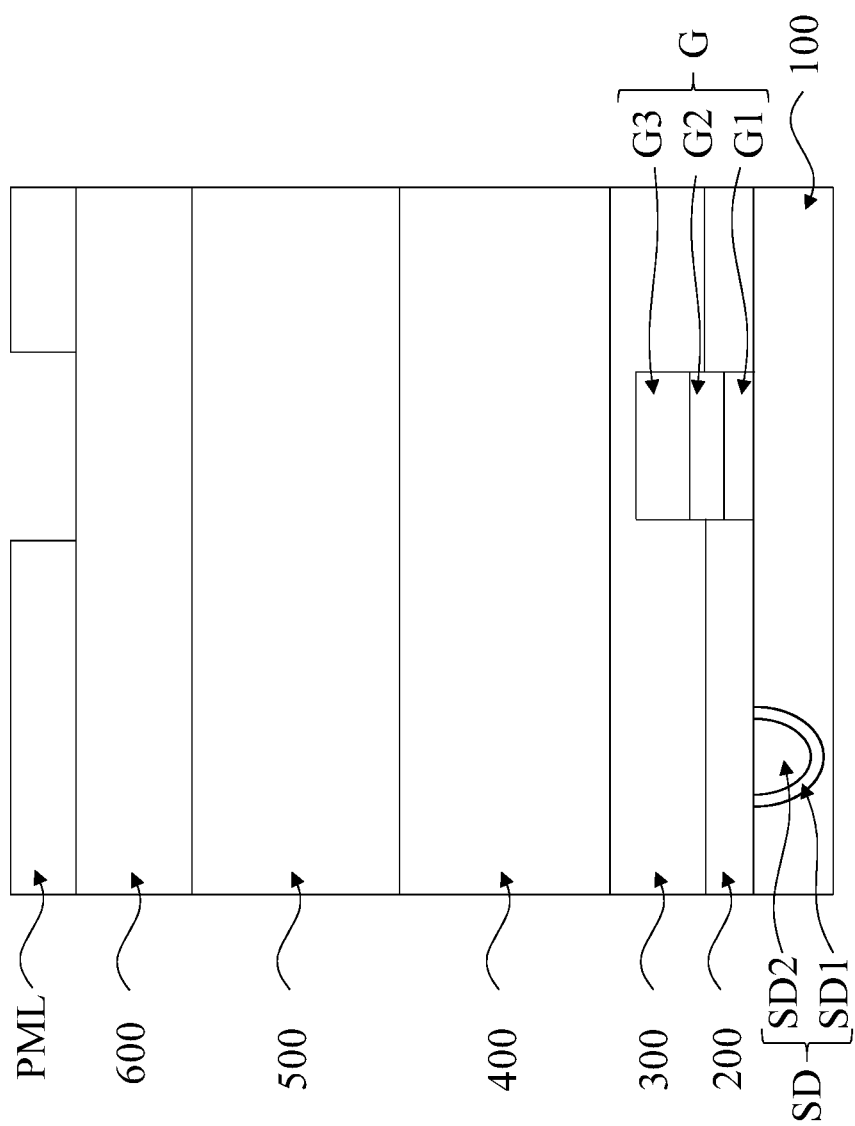
FIG. 8 is a schematic diagram of a semiconductor structure in a manufacturing step according to some embodiments of the present disclosure.

In FIG. 8, the photoresist layer PL is patterned to form a patterned mask layer PML. The material of the patterned mask layer PML is the same as the material of the photoresist layer PL. The photoresist layer PL is patterned by performing a photolithography process. The photoresistor layer PL is exposed to process light according a mask (not shown in FIG. 8). A wavelength of the process light is associated with the critical dimension of the trench TR (shown in FIG. 10). In some embodiments, the process light is a deep ultraviolet (DUV). In other embodiments, the process light is an extreme ultraviolet (EUV), and the photolithography process is a EUV lithography. After exposing the process light, a pattern on the mask is converted to the photoresist layer PL. The photoresist layer PL is then etched according to the converted pattern so as to form the patterned mask layer PML.

Figure 9:
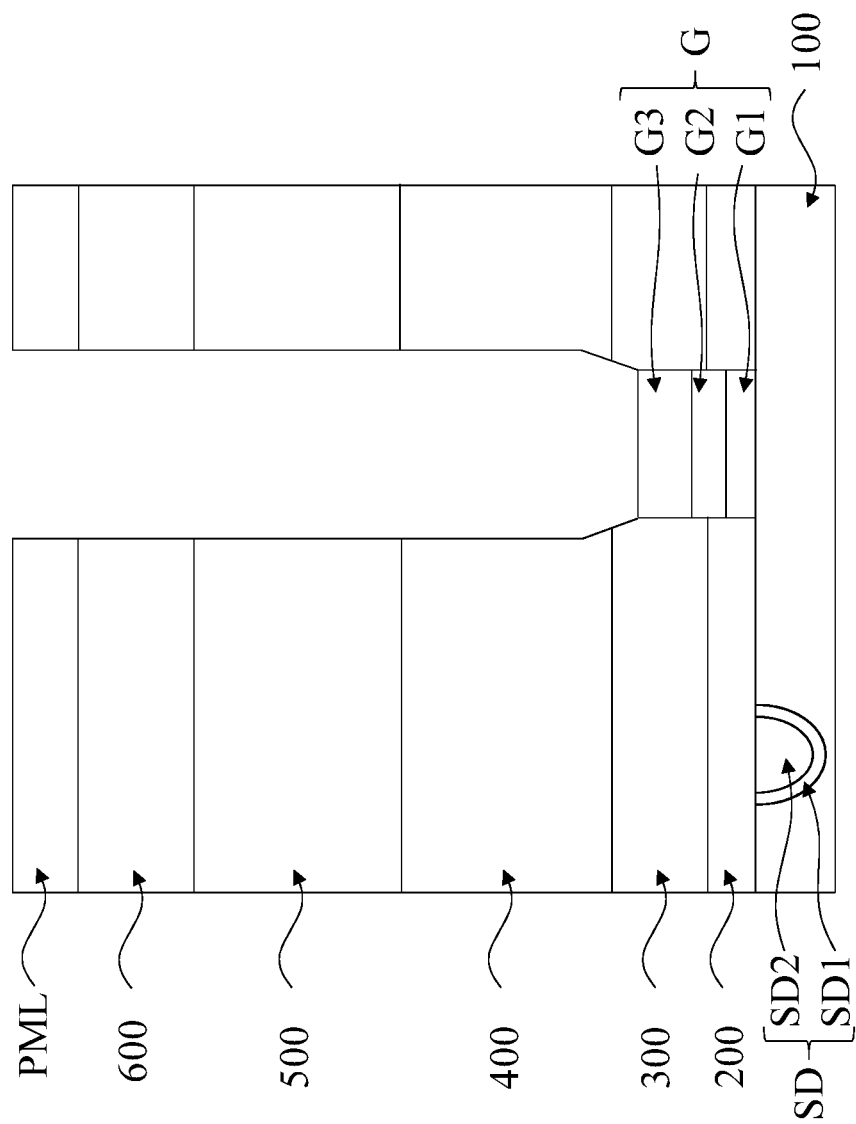
FIG. 9 is a schematic diagram of a semiconductor structure in a manufacturing step according to some embodiments of the present disclosure.
Figure 10:
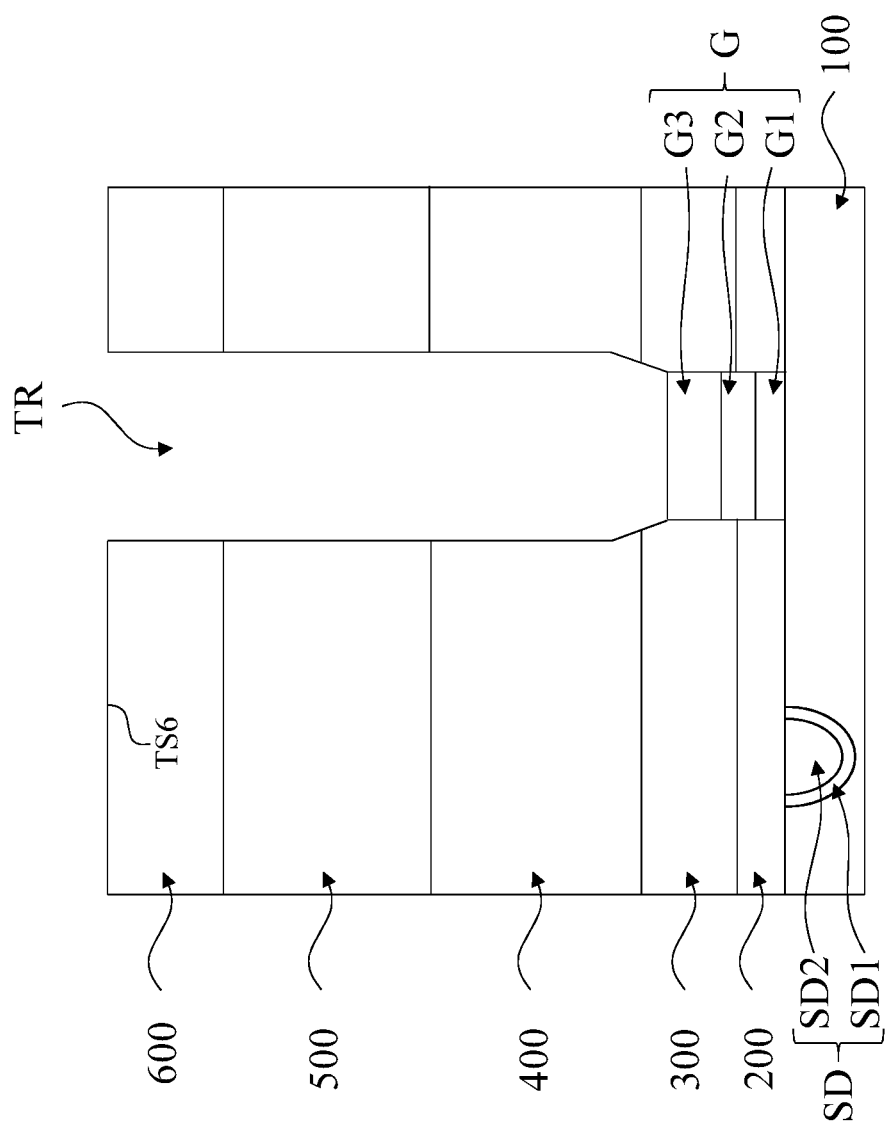
FIG. 10 is a schematic diagram of a semiconductor structure in a manufacturing step according to some embodiments of the present disclosure.

In FIG. 9, the third ILD layer 600, the second ILD layer 500, the first ILD layer 400, and a partial of the second nitride layer 300 are etched according to the pattern mask layer MLK, and the top surface of the metal layer G3 is exposed after etching. In some embodiments, the third ILD layer 600, the second ILD layer 500, the first ILD layer 400, and the partial of the second nitride layer 300 are etched by performing a dry etch process such as a reactive ion etching (RIE). In the embodiment of FIG. 10, the entire top surface of the metal layer G3 is exposed. However, the present disclosure is not limited thereto. In various embodiments, only a partial of the top surface of the metal layer G3 is exposed after etching.

In FIG. 10, the patterned mask layer PML is removed to expose the top surface TS6 of the third ILD layer 600, and the trench TR is formed. In some embodiments, the trench TR is wider at the third ILD layer 600 and narrower at the second nitride layer 300 as illustrated in FIG. 10.

Figure 11:
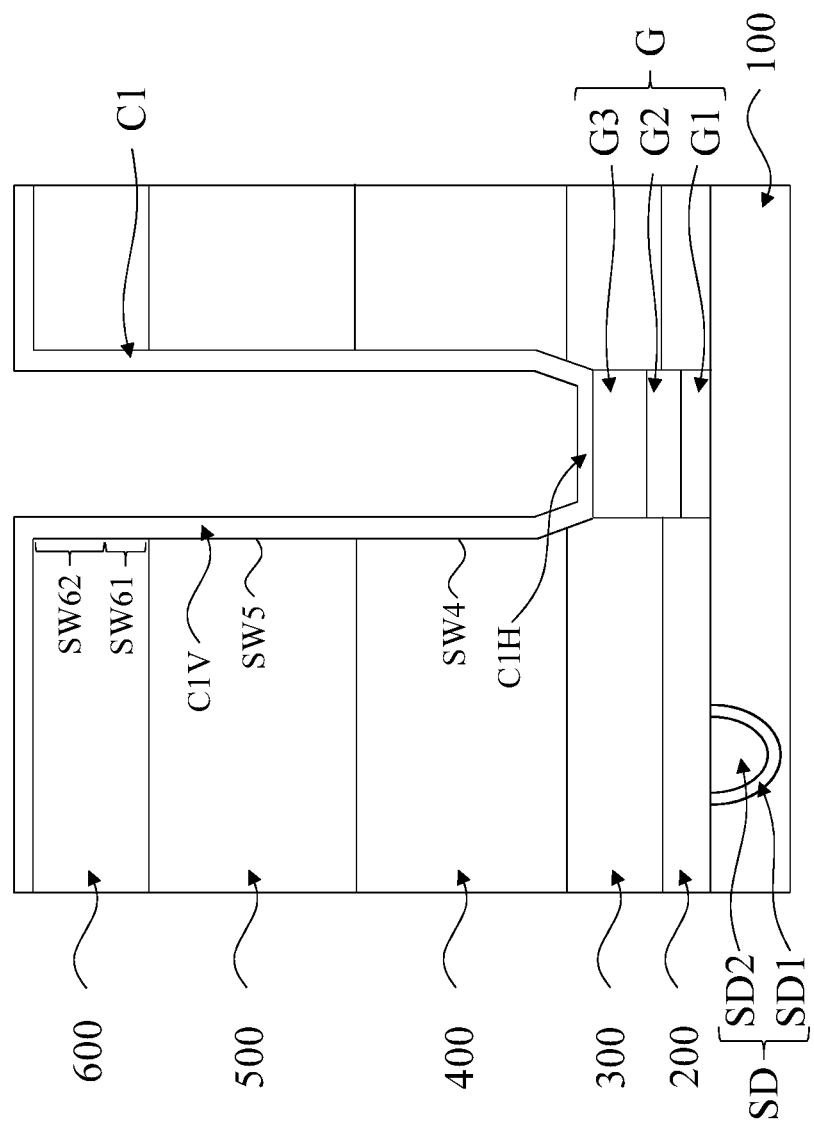
FIG. 11 is a schematic diagram of a semiconductor structure in a manufacturing step according to some embodiments of the present disclosure.

In FIG. 11, the bottom metal layer C1 is deposited over the third ILD layer 600 and along the contour of the trench TR. In some embodiments, the bottom metal layer C1 is deposited by performing a CVD process. The bottom metal layer C1 has a substantially uniform thickness along the contour of the trench TR. As illustrated in FIG. 11, the bottom metal layer C1 includes the horizontal portion C1H and the vertical portion C1V. The horizontal portion C1H is in contact with the top surface of the metal layer G3, and the vertical portion C1V is in contact with the side wall SP4, the side wall SP5, the first portion of side wall SW61, and the second portion of side wall SW62.

Figure 12:
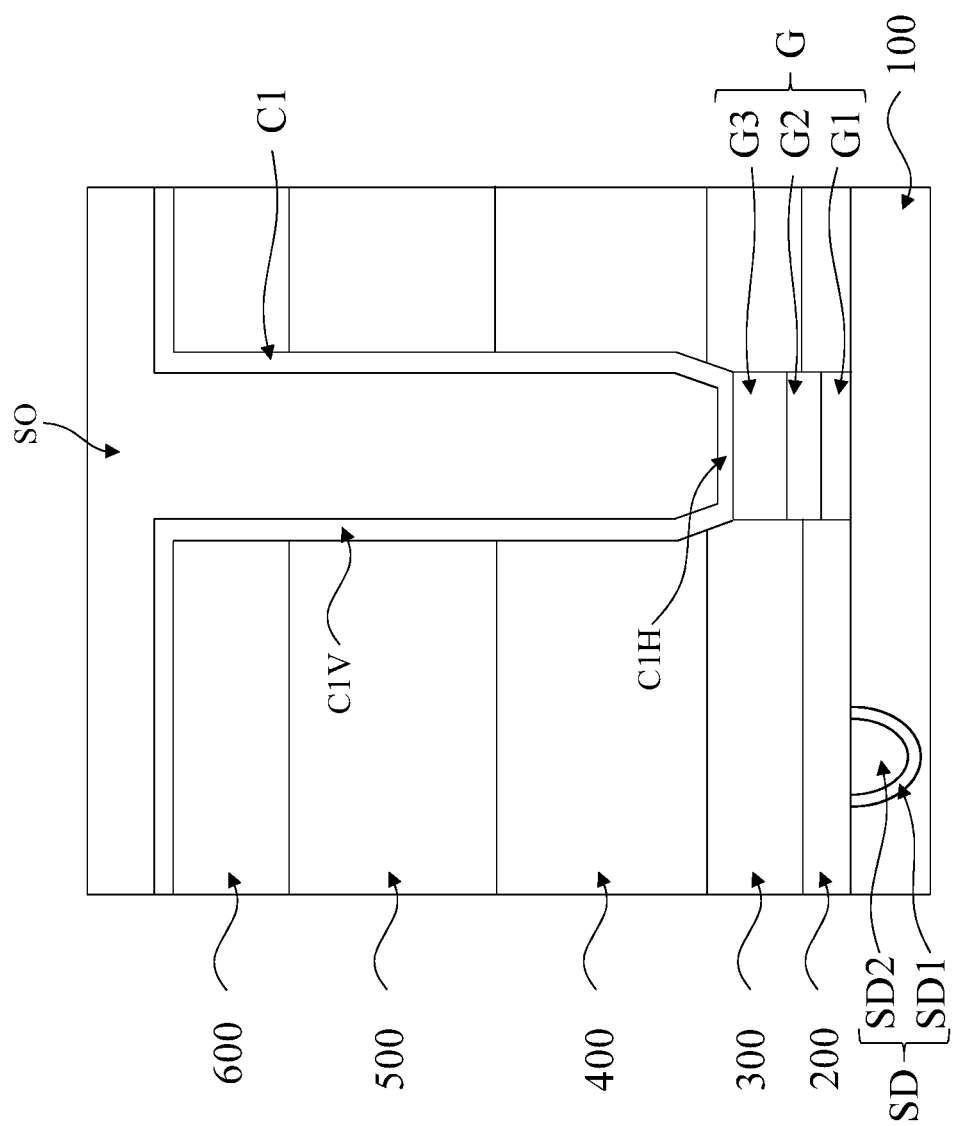
FIG. 12 is a schematic diagram of a semiconductor structure in a manufacturing step according to some embodiments of the present disclosure.

In FIG. 12, a sacrificial oxide layer SO is deposited over the bottom metal layer C1. The sacrificial oxide layer SO has a T-shape to fill the trench TR and cover the bottom metal layer C1 over the third ILD layer 600.

Figure 13:
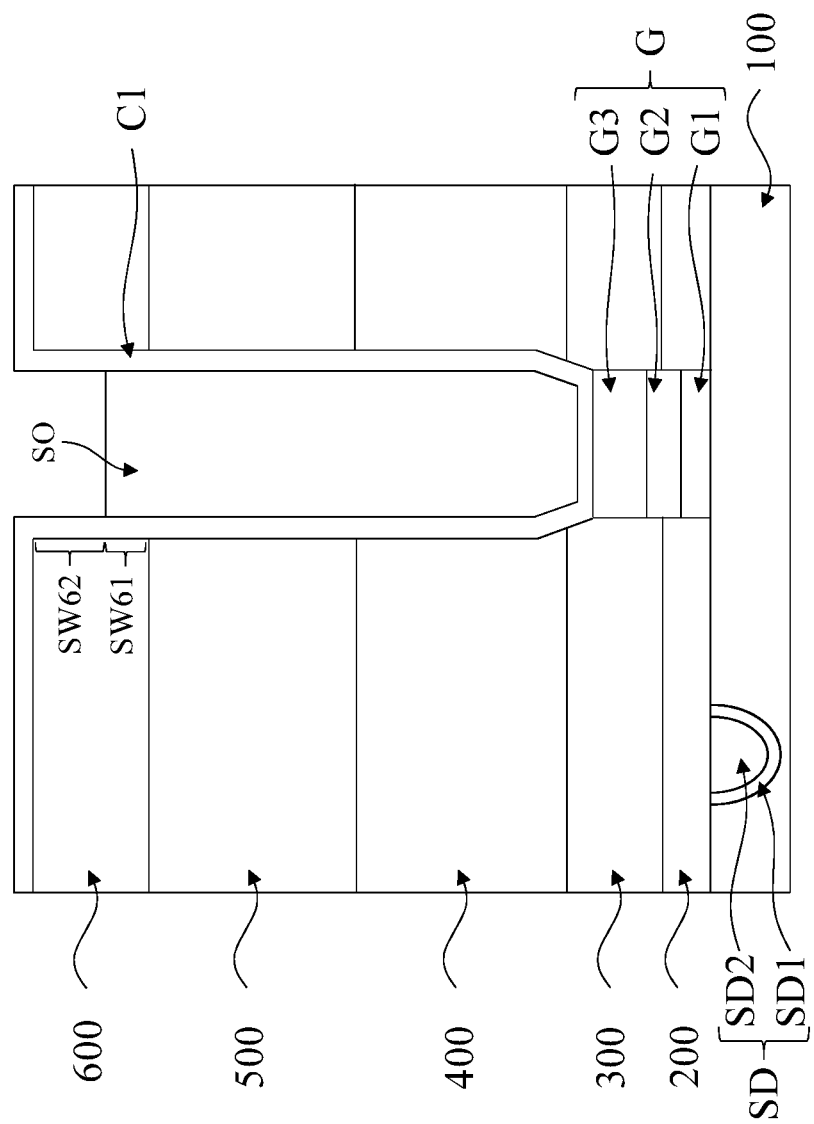
FIG. 13 is a schematic diagram of a semiconductor structure in a manufacturing step according to some embodiments of the present disclosure.

In FIG. 13, the sacrificial oxide layer SO is etched to form a recess. More specifically, the sacrificial oxide layer SO is etched to a level corresponding to a boundary between the first portion of side wall SW61 and the second portion of side wall SW62. In other words, a portion of sacrificial oxide layer SO above the first portion of side wall SW61 is etched.

Figure 14:
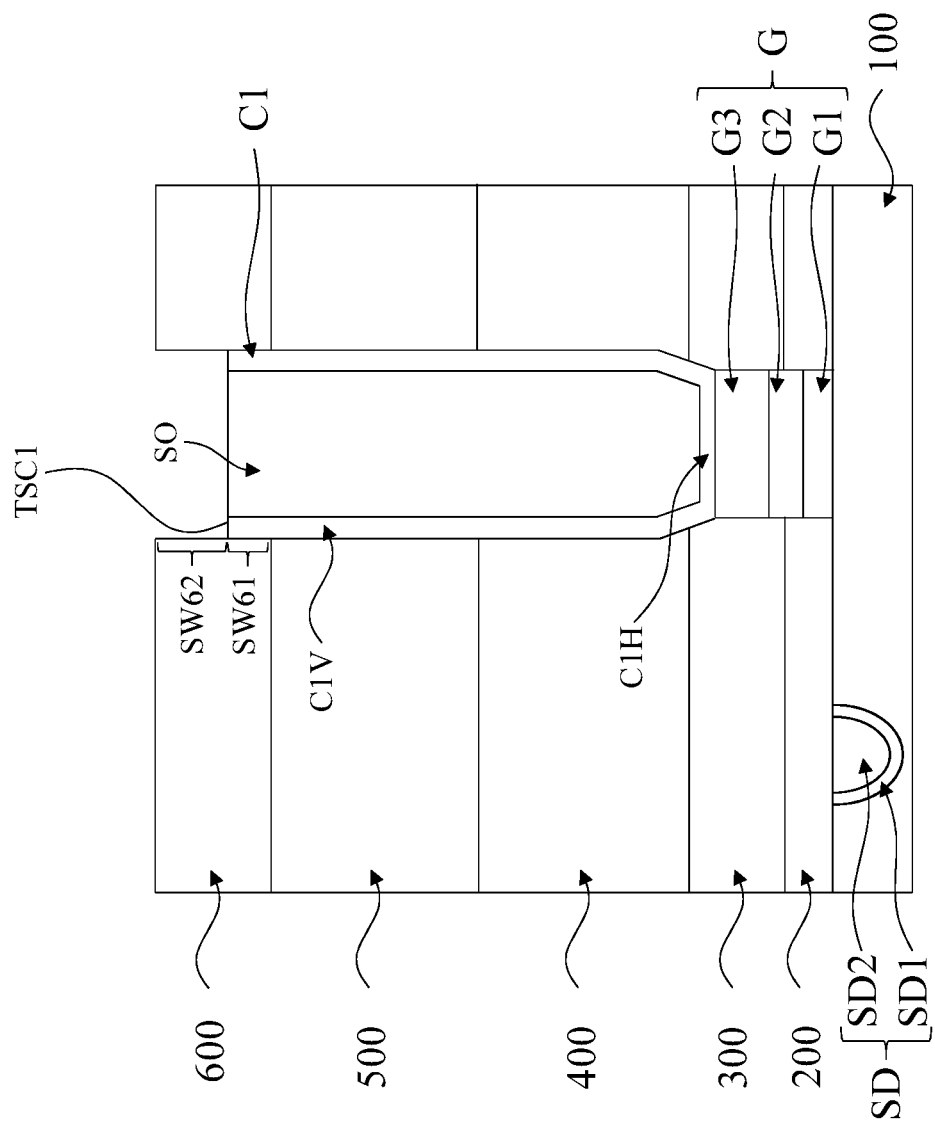
FIG. 14 is a schematic diagram of a semiconductor structure in a manufacturing step according to some embodiments of the present disclosure.

In FIG. 14, the bottom metal layer C1 is etched to expose the top surface TSC1 of the vertical portion C1V of the bottom metal layer C1 and the second portion of side wall SW62 of the third ILD layer 600. The bottom metal layer C1 is etched to make the top surface TSC1 coplanar with the top surface of the sacrificial oxide layer SO. In some embodiments, hydrogen fluoride (HF), nitrogen trifluoride ($NF_3$), carbon tetrafluoride ($CF_4$), Sulphur hexafluoride ($SF_6$), or the combination thereof are used as etchants to etch the bottom metal layer C1. In some embodiments, the etching is performed under the atmospheric pressure and about 285-300 Celsius.

Figure 15:
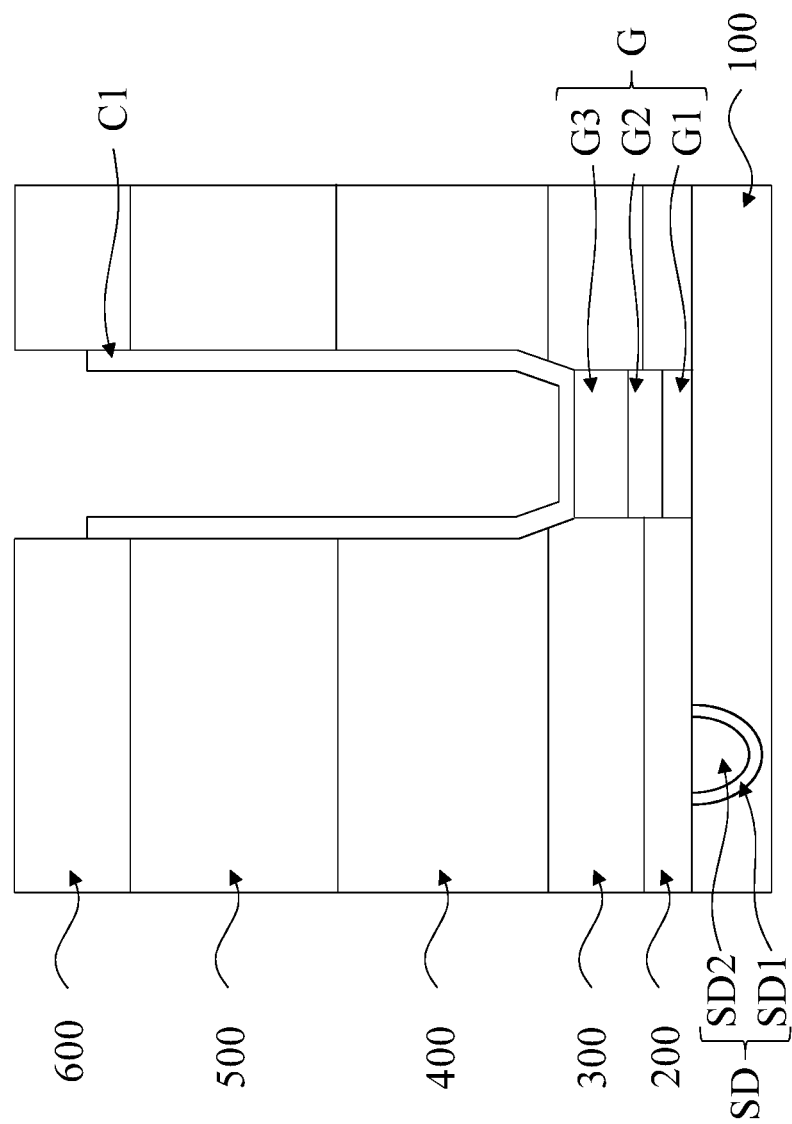
FIG. 15 is a schematic diagram of a semiconductor structure in a manufacturing step according to some embodiments of the present disclosure.

In FIG. 15, the rest of the sacrificial oxide layer SO is removed to expose the remaining bottom metal layer C1. In some embodiments, the rest of the sacrificial oxide layer SO is removed by performing a wet etching.

Figure 16:
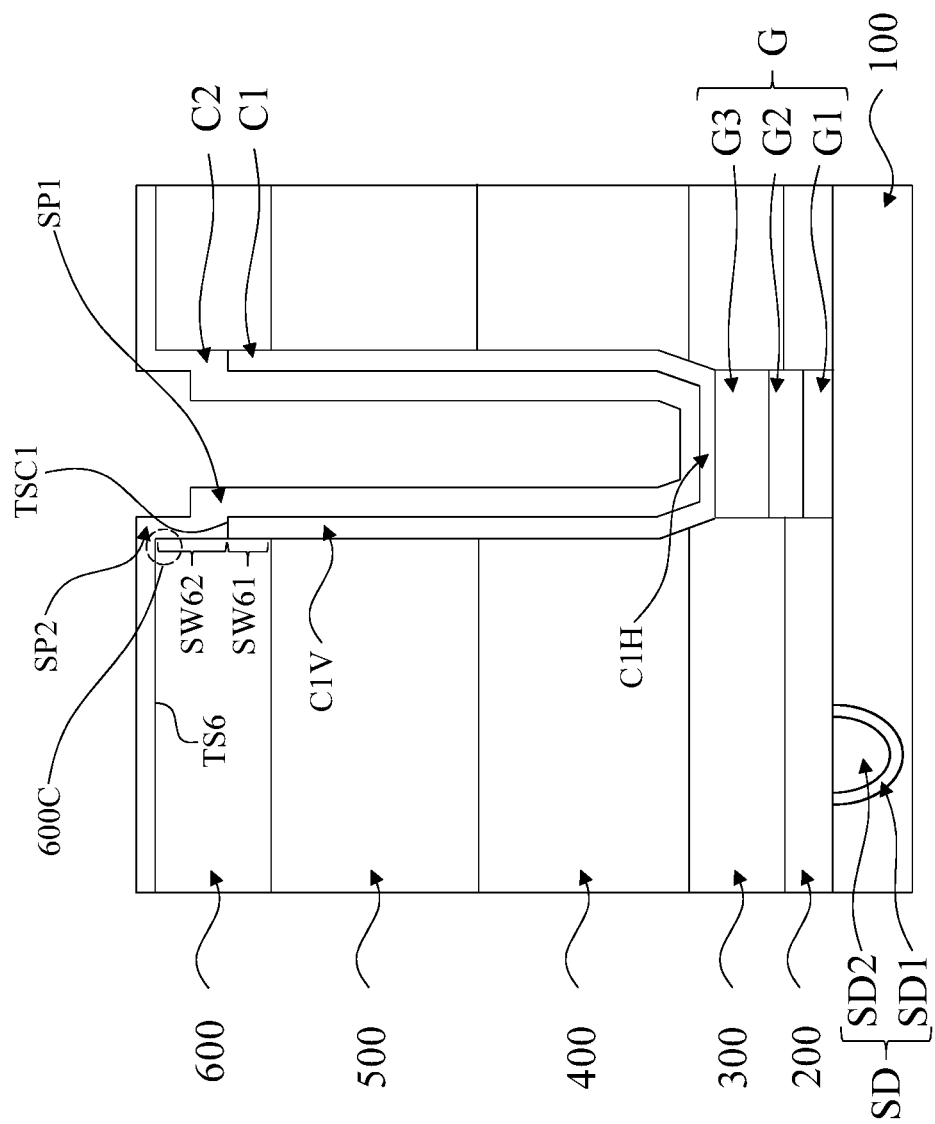
FIG. 16 is a schematic diagram of a semiconductor structure in a manufacturing step according to some embodiments of the present disclosure.

In FIG. 16, the middle insulating layer C2 is deposited over the bottom metal layer C1. More specifically, the middle insulating layer C2 is deposited to cover the bottom metal layer C1, the second portion of side wall SW62, and the top surface TS6 of the third ILD layer 600. As illustrated in FIG. 16, the middle insulating layer C2 includes the first step portion SP1 and the second step portion SP2. The first step portion SP1 is in contact with the vertical portion C1V and the top surface TSC1 of the bottom metal layer C1, and the second step portion SP2 is in contact with the second portion of side wall SW62 and the top surface TS6 of the third ILD layer 600. Alternatively stated, the second step portion SP2 covers the corner 600C of the third ILD layer 600, in which the corner 600C is defined by the top surface TS6 and the second portion of side wall SW62 of the third ILD layer 600.

After the middle insulating layer C2 is deposited, the top metal layer C3 is deposited over the middle insulating layer C2 to form the semiconductor structure 10 as illustrated in FIG. 1.

In some approaches, the bottom metal pad of the capacitor covers the corner of the top SiN layer. Due to the corner rounding effect, a distance between the bottom metal pad and the top metal pad around the corner is smaller than a distance between the bottom metal pad and the top metal pad in other portion (such as at the vertical side wall of ILD layers). Therefore, a chance for leakage current transmitting through the corner portion increases. Thereby, the capacitance of the capacitor decreases, and the performance of the memory decreases as well.

Compared to the above approaches, the trench capacitor C provided by the embodiments of the present disclosure does not cover the corner 600C of the third ILD layer 600. Therefore, the leakage current is decreased; the capacitance of the trench capacitor TR is increased; and the performance of the memory device is improved.

Figure 17:
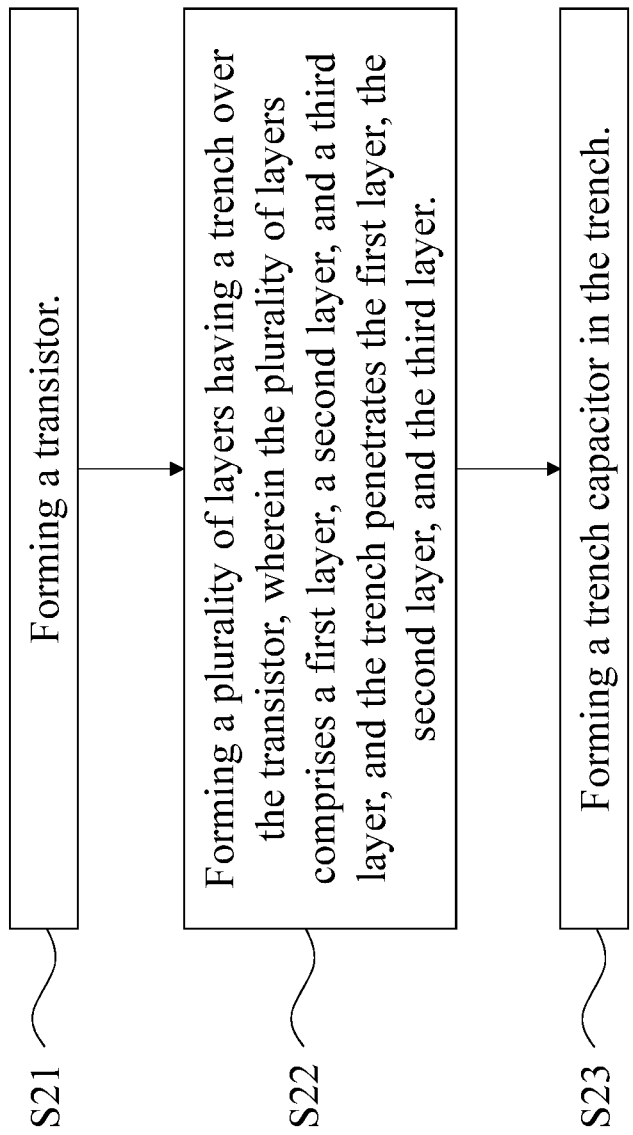
FIG. 17 is a flowchart of a method for manufacturing a semiconductor structure according to some embodiments of the present disclosure.

Reference is made to FIG. 17. FIG. 17 is a flowchart of a method 20 for manufacturing the semiconductor structure 10 as illustrated in FIG. 1 according to some embodiments of the present disclosure. The method 20 includes an operation S21, an operation S22, and an operation S23. To facilitate understanding, the method 20 is described with the numerals designated in the semiconductor structure as shown in FIG. 1 to FIG. 17.

In operation S21, the transistor T is formed. The transistor T is a buried transistor and protected by the first nitride layer 200 and the second nitride layer 300.

In operation S22, the plurality of layers, including the first ILD layer 400, the second ILD layer 500, and the third ILD layer 600, are formed over the transistor T. The plurality of layers are formed with the trench TR, in which the trench TR penetrates the first ILD layer 400, the second ILD layer 500, and the third ILD layer 600. In some embodiments, the trench TR further penetrates a portion of the second nitride layer 300.

In operation S23, the trench capacitor C is formed in the trench TR.

By performing the operations S21, S22, and S23, the semiconductor structure 10 is formed. The above operations are provided for illustrative purposes. Various operations are within the contemplated scope of the present disclosure. In various embodiments, the manufacturing steps shown in FIG. 2 to FIG. 17 are applied by the method 20 to form the semiconductor structure 10.

Figure 18:
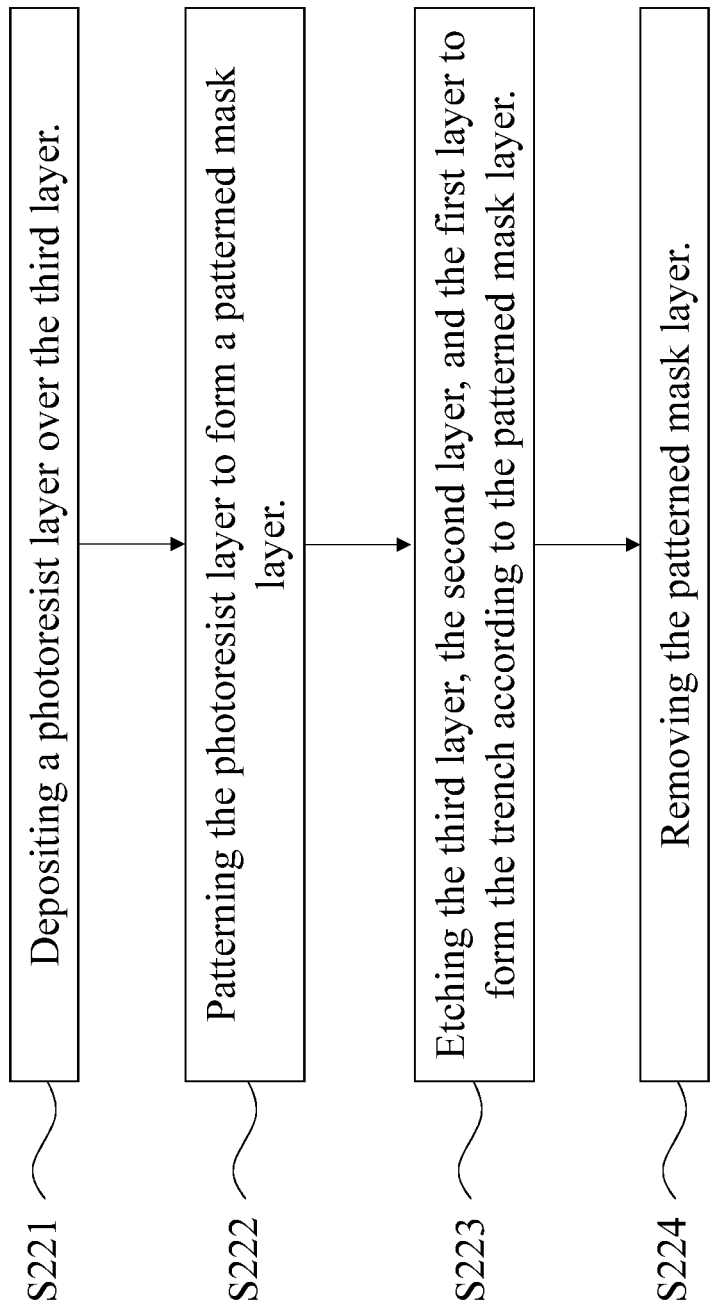
FIG. 18 is a detailed flowchart of a method shown in FIG. 17 according to some embodiments of the present disclosure.
Figure 19:
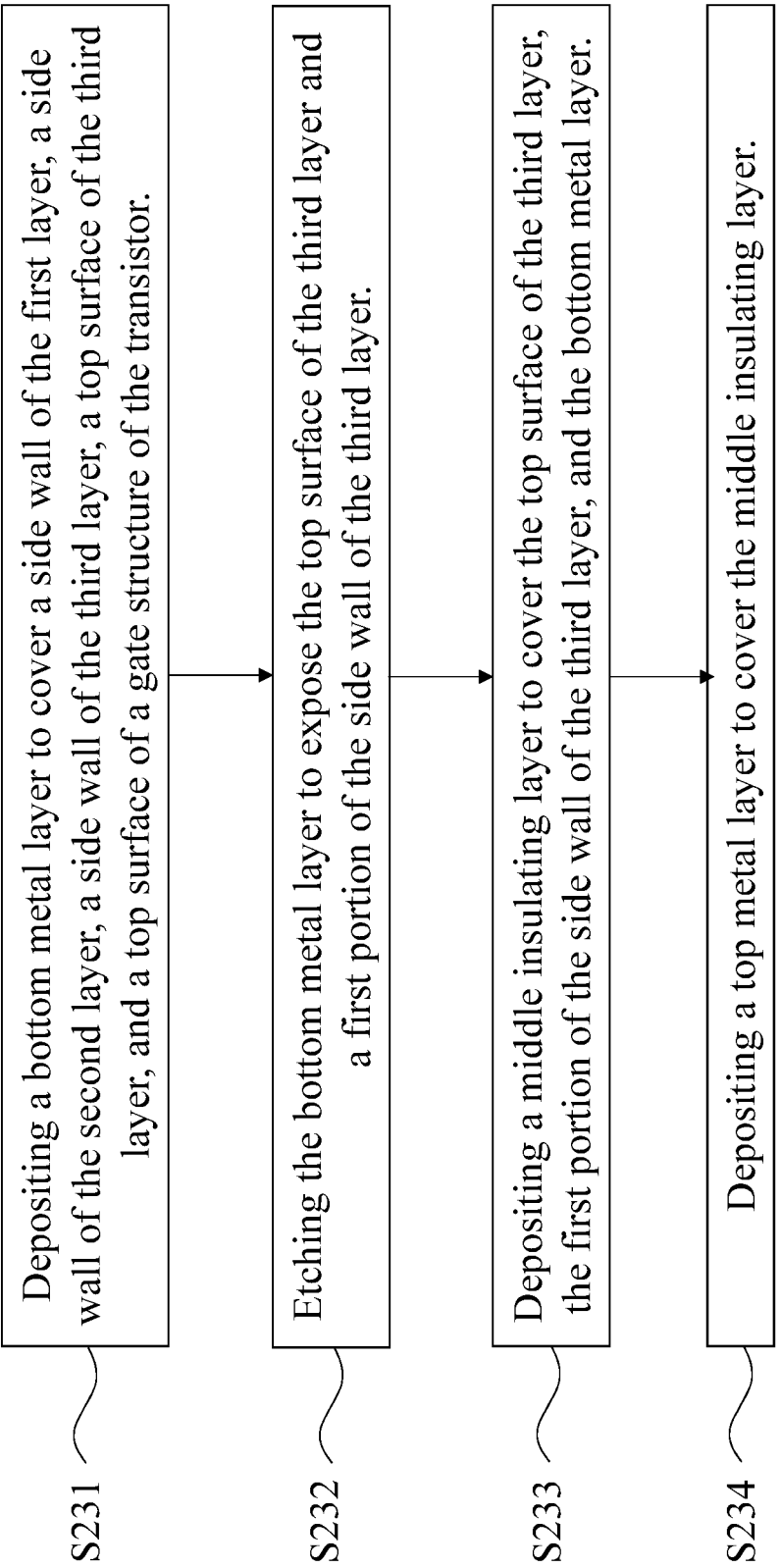
FIG. 19 is a detailed flowchart of a method shown in FIG. 17 according to some embodiments of the present disclosure.
Figure 20:
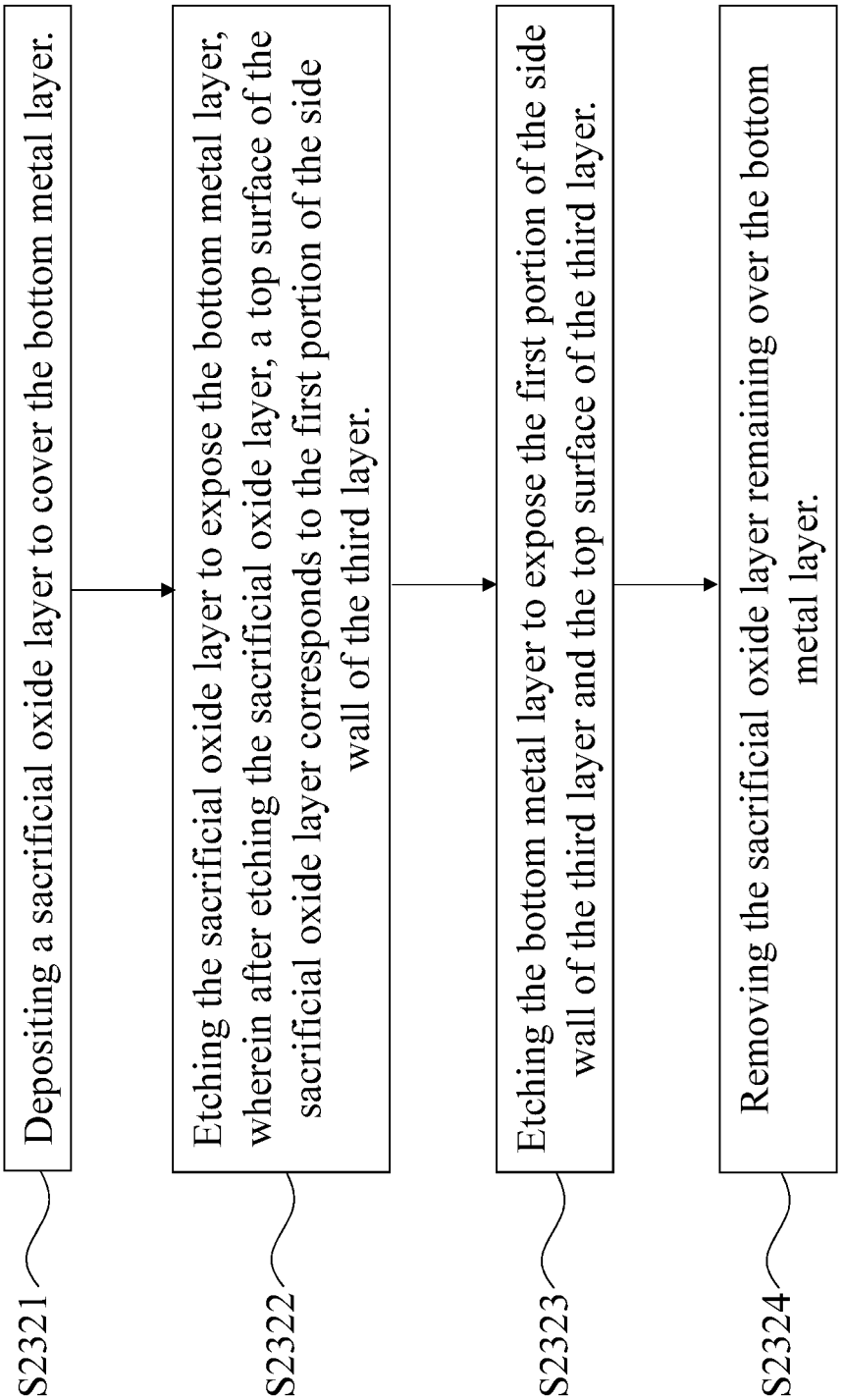
FIG. 20 is a detailed flowchart of a method shown in FIG. 17 according to some embodiments of the present disclosure.

Reference is made to FIG. 18, FIG. 19, and FIG. 20. FIG. 18, FIG. 19, and FIG. 20 are detailed operations of the method 20 shown in FIG. 17.

FIG. 18 is a flowchart of the operation S22 of the method 20 according to some embodiments of the present disclosure.

As illustrated in FIG. 18, the operation S22 includes an operation S221, an operation S222, an operation S223, and an operation S224.

In operation S221, the photoresistor layer PL is deposited over the third ILD layer 600.

In operation S222, the photoresistor layer PL is patterned to form the patterned mask layer PML.

In operation S223, the third ILD layer 600, the second ILD layer 500, the first ILD layer 400 are etched to form the trench TR according to the patterned mask layer PML. In some embodiments, at least portion of the second nitride layer 300 is etched in the operation S223.

In operation S224, the patterned mask layer PML is removed.

FIG. 19 is a flowchart of the operation S23 of the method 20 according to some embodiments of the present disclosure.

As illustrated in FIG. 19, the operation S23 includes an operation S231, an operation S232, an operation S233, and an operation S234.

In operation S231, the bottom metal layer C1 is deposited to cover the side wall SW4 of the first ILD layer 400, the side wall SW5 of the second ILD layer 500, the side wall (including the first portion of side wall SW61 and the second portion of side wall SW62) of the third ILD layer 600, the top surface TS6 of the third ILD layer 600, and the top surface of the gate structure G of the transistor T.

In operation S232, the bottom metal layer C1 is etched to expose the top surface TS6 of the third ILD layer 600 and the second portion of side wall SW62 of the third ILD layer 600.

In operation S233, the middle insulating layer C2 is deposited to cover the top surface TS6 of the third ILD layer 600, the second portion of side wall SW62 of the third ILD layer 600, and the bottom metal layer C1.

In operation S234, the top metal layer C3 is deposited to cover the middle insulating layer C2.

FIG. 20 is a flowchart of the operation S232 of the method 20 according to some embodiments of the present disclosure.

As illustrated in FIG. 20, the operation S232 includes an operation S2321, an operation S2322, an operation S2323, and an operation S2324.

In operation S2321, the sacrificial oxide layer SO is deposited to cover the bottom metal layer C1.

In operation S2322, the sacrificial oxide layer SO is etched to expose the bottom metal layer C1. After etching the sacrificial oxide layer SO, the top surface of the sacrificial oxide layer SO corresponds to the first portion of the side wall SW61 of the third ILD layer 600.

In operation S2323, the bottom metal layer C1 is etched to expose the second portion of side wall SW62 of the third ILD layer 600 and the top surface TS6 of the third ILD layer 600. In some embodiments, after etching the bottom metal layer C1 to expose the second portion of side wall SW62 of the third ILD layer 600 and the top surface TS6 of the third ILD layer 600, the top surface TSC1 of the bottom metal layer C1 is coplanar with the top surface of the sacrificial oxide layer SO. In some embodiments, after etching the bottom metal layer C1 to expose the second portion of side wall SW62 of the third ILD layer 600 and the top surface TS6 of the third ILD layer 600, the remained bottom metal layer C1 still has a portion being in contact with the first portion of side wall SW61 of the third ILD layer 600.

The third ILD layer 600 has a straight side wall. Therefore, the first portion of side wall SW61 and the second portion of side wall SW62 are arranged along a straight line.

In operation S2324, the sacrificial oxide layer SO remaining over the bottom metal layer C1 is removed.

One aspect of the present disclosure provides a semiconductor structure including a first layer, a second layer over the first layer, a third layer over the second layer, and a trench capacitor. The trench capacitor is disposed in a trench penetrating the first layer, the second layer, and the third layer. The trench capacitor includes a bottom metal layer, a middle insulating layer, and a top metal layer. The bottom metal layer covers a side wall of the first layer, a side wall of the second layer, and a first portion of a side wall of the third layer. The middle insulating layer covers the bottom metal layer and a second portion of the side wall of the third layer. The top metal layer covers the middle insulating layer.

Another aspect of the present disclosure provides a semiconductor structure including a transistor and a trench capacitor. The transistor includes a gate structure. The trench capacitor is in contact with the gate structure. The trench capacitor includes a bottom metal layer, a middle insulating layer, and a top metal layer. The bottom metal layer has a vertical portion and a horizontal portion. The horizontal portion is in contact with the gate structure. The middle insulating layer has a first step portion covering a top surface of the vertical portion of the bottom metal layer. The top metal layer covers the middle insulating layer in its entirety.

Another aspect of the present disclosure provides a method for manufacturing a semiconductor structure, including the operations of: forming a transistor; forming a plurality of layers having a trench over the transistor, wherein the plurality of layers comprises a first layer, a second layer, and a third layer, and the trench penetrates the first layer, the second layer, and the third layer; and forming a trench capacitor in the trench. The operation of forming a trench capacitor in the trench includes the operations of: depositing a bottom metal layer to cover a side wall of the first layer, a side wall of the second layer, a side wall of the third layer, a top surface of the third layer, and a top surface of a gate structure of the transistor; etching the bottom metal layer to expose the top surface of the third layer and a first portion of the side wall of the third layer; depositing a middle insulating layer to cover the top surface of the third layer, the first portion of the side wall of the third layer, and the bottom metal layer; and depositing a top metal layer to cover the middle insulating layer.

Although the present disclosure and its advantages have been described in detail, it should be understood that various changes, substitutions and alterations can be made herein without departing from the spirit and scope of the disclosure as defined by the appended claims.

For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A semiconductor structure, comprising:
   a first layer;
   a second layer over the first layer;
   a third layer over the second layer;
   a trench capacitor disposed in a trench penetrating the first layer, the second layer, and the third layer, wherein the trench capacitor comprises:
     a bottom metal layer covering a side wall of the first layer, a side wall of the second layer, and a first portion of a side wall of the third layer;
     a middle insulating layer covering the bottom metal layer and a second portion of the side wall of the third layer; and
     a top metal layer covering the middle insulating layer; and
   a transistor disposed below the first layer and comprising a gate structure, wherein the gate structure is in contact with the bottom metal layer.

2. The semiconductor structure of claim 1, wherein the bottom metal layer includes titanium (Ti), the top metal layer includes Ti, and the middle insulating layer includes zirconium oxide ($ZrO_2$).

3. The semiconductor structure of claim 1, wherein the middle insulating layer further covers a top surface of the third layer.

4. The semiconductor structure of claim 1, wherein the middle insulating layer is in contact with a corner of the third layer, wherein the corner connects a top surface of the third layer and the second portion of the side wall of the third layer.

5. The semiconductor structure of claim 1, wherein the first portion of the side wall of the third layer and the second portion of the side wall of the third layer are arranged in a straight line.

6. The semiconductor structure of claim 1, wherein the first layer includes borophosphosilicate glass (BPSG), the second layer includes tetraethoxysilane (TEOS), and the third layer includes silicon nitride (SiN).

7. A semiconductor structure, comprising:
   a transistor comprising a gate structure; and
   a trench capacitor in contact with the gate structure, wherein the trench capacitor comprises:
     a bottom metal layer having a vertical portion and a horizontal portion, wherein the horizontal portion is in contact with the gate structure;
     a middle insulating layer having a first step portion covering a top surface of the vertical portion of the bottom metal layer; and
     a top metal layer covering the middle insulating layer in its entirety.

8. The semiconductor structure of claim 7, further comprising:
   a first layer over the transistor;
   a second layer over the first layer; and
   a third layer over the second layer,
   wherein the trench capacitor is disposed in a trench penetrating the first layer, the second layer, and the third layer.

9. The semiconductor structure of claim 8, wherein the middle insulating layer further has a second step portion covering and in contact with a top surface of the third layer and a first portion of a side wall of the third layer.

10. The semiconductor structure of claim 9, wherein the bottom metal layer covers a second portion of the side wall of the third layer.

11. The semiconductor structure of claim 10, wherein the first portion of the side wall of the third layer and the second portion of the side wall of the third layer are arranged in a straight line.

12. The semiconductor structure of claim 9, wherein the top metal layer has a first step portion and a second step portion, wherein the first step portion of the top metal layer covers the first step portion of the middle insulating layer, and the second step portion of the top metal layer convers the second step portion of the middle insulating layer.

13. The semiconductor structure of claim 12, wherein the trench capacitor forms an opening extending from the third layer to the first layer, wherein the opening has a first horizontal width associated with the first portion of the third layer and a second horizontal width associated with the second portion of the third layer, wherein the second horizontal width is greater than the first horizontal width.

14. A method for manufacturing a semiconductor structure, comprising:
   forming a transistor;
   forming a plurality of layers having a trench over the transistor, wherein the plurality of layers comprises a first layer, a second layer, and a third layer, and the trench penetrates the first layer, the second layer, and the third layer; and
   forming a trench capacitor in the trench, comprising:
      depositing a bottom metal layer to cover a side wall of the first layer, a side wall of the second layer, a side wall of the third layer, a top surface of the third layer, and a top surface of a gate structure of the transistor;
      etching the bottom metal layer to expose the top surface of the third layer and a first portion of the side wall of the third layer;
      depositing a middle insulating layer to cover the top surface of the third layer, the first portion of the side wall of the third layer, and the bottom metal layer; and
      depositing a top metal layer to cover the middle insulating layer.

15. The method of claim 14, wherein the operation of forming the plurality of layers having the trench over the transistor comprises:
   depositing a photoresist layer over the third layer;
   patterning the photoresist layer to form a patterned mask layer;
   etching the third layer, the second layer, and the first layer to form the trench according to the patterned mask layer; and
   removing the patterned mask layer.

16. The method of claim 14, wherein the operation of etching the bottom metal layer to expose the top surface of the third layer and the first portion of the side wall of the third layer comprises:
   depositing a sacrificial oxide layer to cover the bottom metal layer;
   etching the sacrificial oxide layer to expose the bottom metal layer, wherein after etching the sacrificial oxide layer, a top surface of the sacrificial oxide layer corresponds to the first portion of the side wall of the third layer;
   etching the bottom metal layer to expose the first portion of the side wall of the third layer and the top surface of the third layer; and
   removing the sacrificial oxide layer remaining over the bottom metal layer.

17. The method of claim 16, wherein after the operation of etching the bottom metal layer to expose the first portion of the side wall of the third layer and the top surface of the third layer, a top surface of the bottom metal layer is coplanar with a top surface of the sacrificial oxide layer.

18. The method of claim 16, wherein after the operation of etching the bottom metal layer to expose the first portion of the side wall of the third layer and the top surface of the third layer, the bottom metal layer has a portion in contact with a second portion of the side wall of the third layer.

19. The method of claim 18, wherein the first portion of the side wall of the third layer and the second portion of the side wall of the third layer are arranged in a straight line.

* * * * *